(12) United States Patent
Wu et al.

(10) Patent No.: US 7,955,964 B2
(45) Date of Patent: Jun. 7, 2011

(54) DISHING-FREE GAP-FILLING WITH MULTIPLE CMPS

(75) Inventors: Ming-Yuan Wu, Hsin-Chu (TW); Kong-Beng Thei, Hsin-Chu (TW); Chiun-Han Yeh, Tainan (TW); Harry Chuang, Austin, TX (US); Mong-Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 138 days.

(21) Appl. No.: 12/152,380

(22) Filed: May 14, 2008

(65) Prior Publication Data
US 2009/0286384 A1   Nov. 19, 2009

(51) Int. Cl.
*H01L 21/3205* (2006.01)
*H01L 21/4763* (2006.01)

(52) U.S. Cl. ......................................................... 438/587
(58) Field of Classification Search .................... 438/587
See application file for complete search history.

(56) References Cited

U.S. PATENT DOCUMENTS

| | | | |
|---|---|---|---|
| 5,516,729 A * | 5/1996 | Dawson et al. | 438/623 |
| 5,541,132 A | 7/1996 | Davies et al. | |
| 6,144,071 A | 11/2000 | Gardner et al. | |
| 6,251,764 B1 | 6/2001 | Pradeep et al. | |
| 6,632,714 B2 | 10/2003 | Yoshikawa | |
| 6,737,348 B2 | 5/2004 | Satake et al. | |
| 7,064,071 B2 | 6/2006 | Schwan | |
| 7,183,199 B2 | 2/2007 | Liu et al. | |
| 7,495,280 B2 | 2/2009 | Lo | |
| 2001/0010962 A1 | 8/2001 | Chen et al. | |
| 2003/0011080 A1 | 1/2003 | Deshpande et al. | |
| 2003/0020111 A1 | 1/2003 | Bevan | |
| 2004/0161919 A1 | 8/2004 | Cha et al. | |
| 2004/0212009 A1 | 10/2004 | Wang et al. | |
| 2005/0059228 A1 | 3/2005 | Bu et al. | |
| 2005/0064722 A1 | 3/2005 | Hsu et al. | |
| 2005/0266639 A1 | 12/2005 | Frohberg et al. | |

(Continued)

FOREIGN PATENT DOCUMENTS
CN   1319881 A   10/2001
(Continued)

OTHER PUBLICATIONS

Augendre, E., et al., "Thin L-Shaped Spacers for CMOS Devices," IEEE, 2003, pp. 219-222.

*Primary Examiner* — N Drew Richards
*Assistant Examiner* — Grant S Withers
(74) *Attorney, Agent, or Firm* — Slater & Matsil, L.L.P.

(57) ABSTRACT

A method of forming an integrated circuit structure includes providing a semiconductor substrate; forming patterned features over the semiconductor substrate, wherein gaps are formed between the patterned features; filling the gaps with a first filling material, wherein the first filling material has a first top surface higher than top surfaces of the patterned features; and performing a first planarization to lower the top surface of the first filling material, until the top surfaces of the patterned features are exposed. The method further includes depositing a second filling material, wherein the second filling material has a second top surface higher than the top surfaces of the patterned features; and performing a second planarization to lower the top surface of the second filling material, until the top surfaces of the patterned features are exposed.

20 Claims, 10 Drawing Sheets

U.S. PATENT DOCUMENTS

| | | |
|---|---|---|
| 2006/0102955 A1 | 5/2006 | Chen et al. |
| 2006/0151840 A1 | 7/2006 | Maekawa |
| 2006/0205169 A1 | 9/2006 | Yoon et al. |
| 2006/0220152 A1 | 10/2006 | Huang et al. |
| 2007/0023822 A1 | 2/2007 | Sung et al. |
| 2007/0122958 A1 | 5/2007 | Fang |
| 2007/0218633 A1 | 9/2007 | Prinz et al. |
| 2007/0267678 A1 | 11/2007 | Lo |
| 2010/0022061 A1 | 1/2010 | Wu et al. |

FOREIGN PATENT DOCUMENTS

| | | |
|---|---|---|
| CN | 1463045 A | 12/2003 |
| CN | 1846313 A | 10/2006 |
| CN | 101170066 A | 4/2008 |

\* cited by examiner

DISHING-FREE GAP-FILLING WITH MULTIPLE CMPS

TECHNICAL FIELD

This invention relates generally to integrated circuits, and more particularly to gap-filling in the manufacture of integrated circuits, and even more particularly to reducing dishing effects and voids in gap-filling processes.

BACKGROUND

Chemical mechanical polish (CMP) is a process that is used for the planarization of semiconductor wafers, particularly in gap-filling processes. CMP takes advantages of the synergetic effect of both physical and chemical forces for the polishing of wafers. It is performed by applying a load force to the back of a wafer while it rests on a pad. Both the pad and wafer are counter-rotated while a slurry, containing both abrasives and reactive chemicals, is passed underneath. CMP is an effective way to achieve truly global planarization over the entire substrate.

The existence of pattern effects in films polished by CMP processes is well known. There is a problem called a "micro-loading effect" that occurs due to a difference in pattern density, and it degrades the uniformity of pattern sizes. The "micro-loading effect" pertains to a phenomenon occurring upon simultaneously etching or polishing a pattern of a higher density and a pattern of a lower density; due to a difference in etching/polishing rate of a film from one location to another, the amount of reaction produced by the etching/polishing becomes locally dense or sparse, and convection of a large amount of reaction products by etching with a low volatility causes a non-uniformity in etching rate. Big variations in effective pattern density have been shown to result in significant and undesirable post-polish film thickness variation. Particularly, this non-uniformity causes a "dishing" effect on the surface of the circuit. "Dishing" means that a surface at a location with a lower pattern density was polished faster than the surface with a higher pattern density, hence forming a dish-shaped surface.

FIGS. 1 through 3 illustrate a conventional gap-filling process involving CMP. Referring to FIG. 1, polysilicon patterns 302 are formed over semiconductor substrate 300. Due to the non-uniformity in the pattern density, a pattern-dense region and a pattern-sparse region are formed. The pattern-dense region has a higher density and smaller spacing between polysilicon patterns 302 than the pattern-sparse region. In FIG. 2, inter-layer dielectric (ILD) 304 is deposited to fill the gaps between polysilicon patterns 302, and is deposited to a level higher than the top surface of polysilicon patterns 302. The topography of polysilicon patterns 302 is transferred partially to the top surface of ILD 304, which in turn has an uneven top surface. In addition, voids 306 may be generated, particularly in the pattern-dense region, in which the gaps have relatively high aspect ratios.

FIG. 3 illustrates the CMP for removing excess ILD 304. The CMP is carried out to remove the portion of ILD 304 over polysilicon patterns 302, until the top surfaces of polysilicon patterns 302 are exposed. The difference in the pattern densities between the pattern-dense region and the pattern-sparse region results in the non-uniformity in the CMP. For example, the topography in the top surface of ILD 304 has a lesser effect on the pattern-dense region than on the pattern-sparse region. As a result, dishing results in the pattern-sparse region, which dishing adversely affects the subsequent processes. On the other hand, the CMP may cause voids 306 to be exposed. In the subsequent processes, voids 306 may be undesirably filled with conductive materials, and may cause shorting of integrated circuits, or an increase in the RC delay.

Various methods have been explored to reduce or eliminate the micro-loading effect. For example, dummy patterns are created in the pattern-sparse region to increase the corresponding pattern density. However, the dummy patterns may adversely increase the RC delay. Further, there are regions unsuitable for forming dummy patterns. Accordingly, new gap-filling methods with reduced micro-loading effects are needed.

SUMMARY OF THE INVENTION

In accordance with one aspect of the present invention, a method of forming an integrated circuit structure includes providing a semiconductor substrate; forming patterned features over the semiconductor substrate, wherein gaps are formed between the patterned features; filling the gaps with a first filling material, wherein the first filling material has a first top surface higher than top surfaces of the patterned features; and performing a first planarization to lower the first top surface of the first filling material, until the top surfaces of the patterned features are exposed. The method further includes depositing a second filling material, wherein the second filling material has a second top surface higher than the top surfaces of the patterned features; and performing a second planarization to lower the second top surface of the second filling material, until the top surfaces of the patterned features are exposed.

In accordance with another aspect of the present invention, a method of forming an integrated circuit structure includes providing a semiconductor substrate; forming gate strips over the semiconductor substrate, wherein gaps are formed between the gate strips, and wherein the integrated circuit structure comprises a pattern-dense region and a pattern-sparse region, with a higher pattern density of the gate strips in the pattern-dense region than in the pattern-sparse region; forming a contact etch stop layer (CESL) having first portions directly over the gate strips, and second portions in the gaps; filling the gaps with a first inter-layer dielectric (ILD), wherein the first ILD has a first top surface higher than top surfaces of the gate strips; performing a first chemical mechanical polish (CMP), until the first top surface of the first ILD is no higher than top surfaces of the first portions of the CESL; depositing a second ILD over the first ILD and the gate strips; and performing a second CMP, until a second top surface of the second ILD is no higher than the top surfaces of the first portions of the CESL.

In accordance with yet another aspect of the present invention, a method of forming an integrated circuit structure includes providing a semiconductor substrate; forming a dielectric layer over the semiconductor substrate; forming openings in the dielectric layer; filling the openings with a first conductive material, wherein a top surface of the first conductive material is higher than a top surface of the dielectric layer; performing a first CMP on the first conductive material to expose the top surface of the dielectric layer; forming a second conductive material over the first conductive material and the dielectric layer; and performing a second CMP on the second conductive material to expose the top surface of the dielectric layer.

The advantageous features of the present invention include reduced dishing effects and reduced voids for gap-filling processes.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel gap filling method is provided. The intermediate stages in the manufacturing of a preferred embodiment of the present invention are illustrated. The variations of the preferred embodiment are then discussed. Throughout the various views and illustrative embodiments of the present invention, like reference numbers are used to designate like elements.

Figure 1:
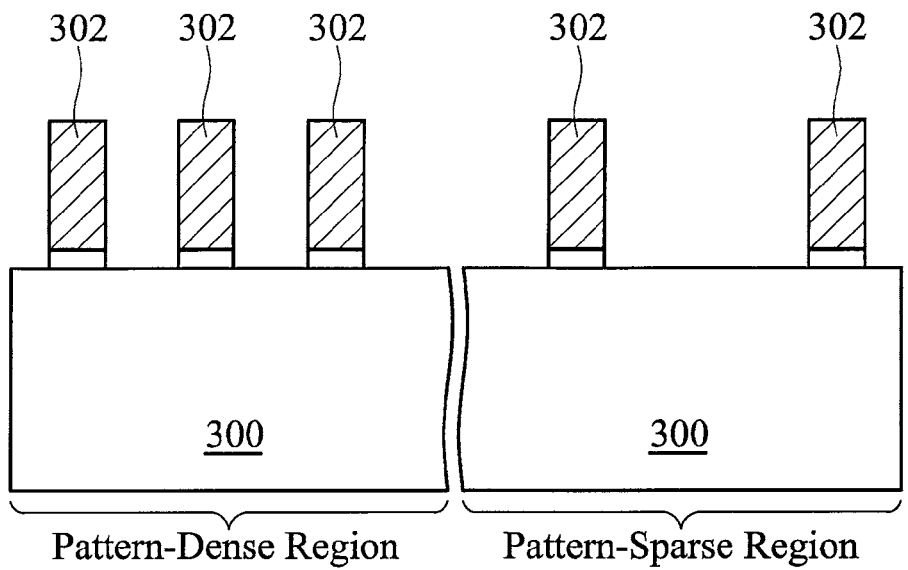
FIGS. 1 through 3 illustrate a conventional gap-filling process, in which an inter-layer dielectric is filled into the gaps between polysilicon patterns.
Figure 2:
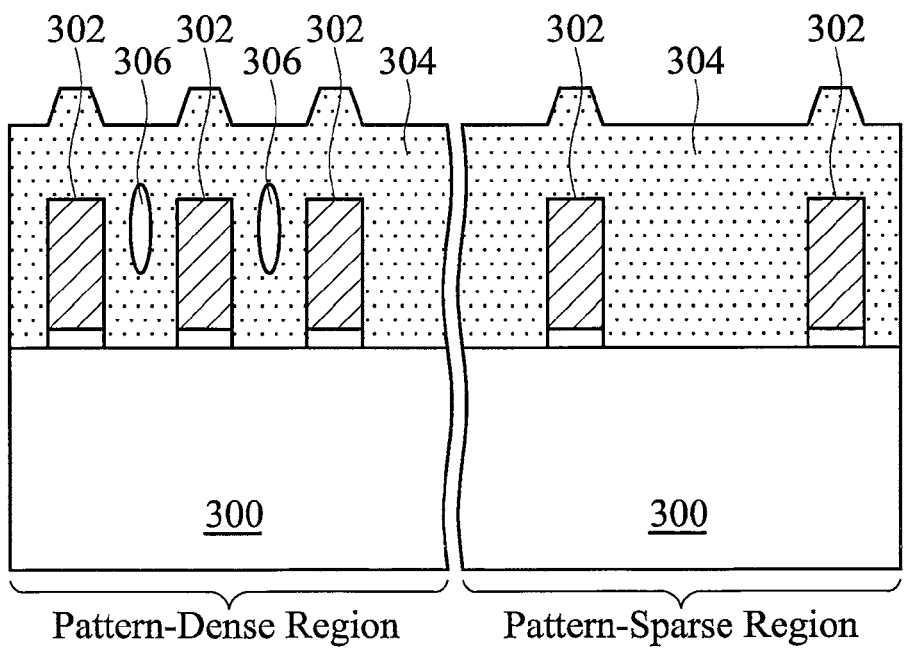
Figure 3:
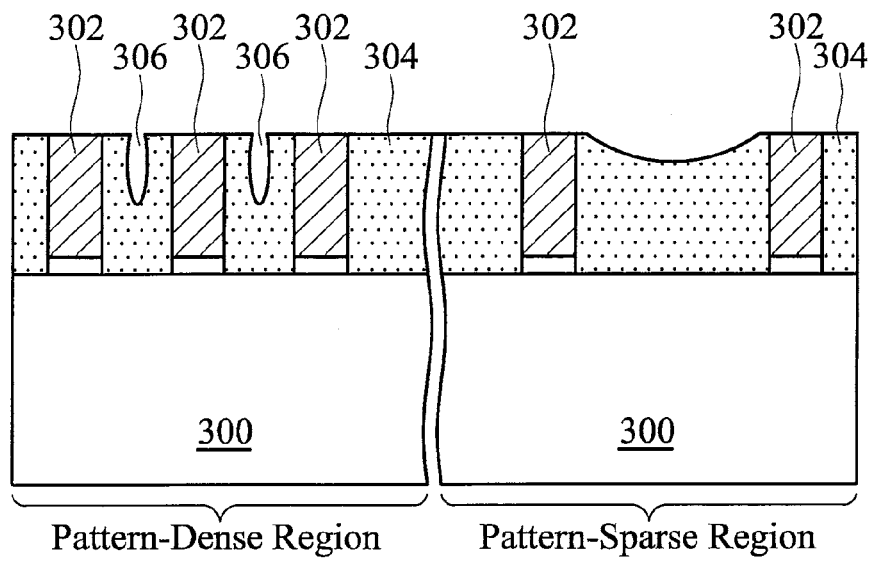
Figure 4:
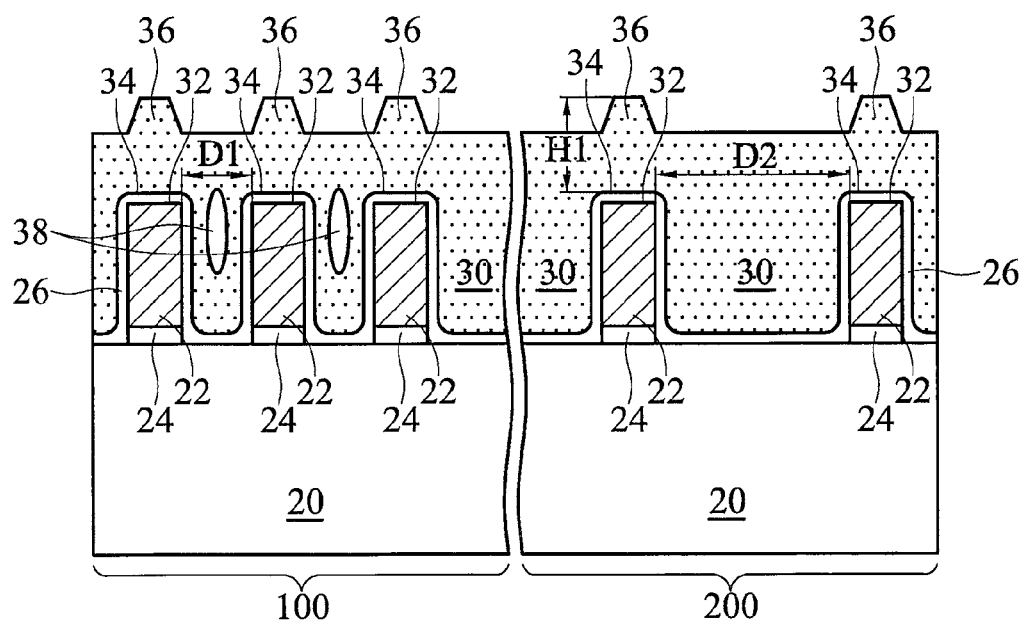
FIGS. 4 through 7B are cross-sectional views of intermediate stages in the manufacturing of an embodiment of the present invention, in which more than one chemical mechanical polish (CMP) is performed to reduce the micro-loading effect.

Referring to FIG. 4, semiconductor substrate 20 is provided. In the preferred embodiment, semiconductor substrate 20 includes silicon. Other commonly used materials, such as carbon, germanium, gallium, and the like, may also be included in semiconductor substrate 20. Semiconductor substrate 20 may be formed of single-crystalline or compound materials, and may be a bulk substrate or a semiconductor-on-insulator (SOI) substrate.

Gate strips 22 and gate dielectrics 24 are formed over semiconductor substrate 20. In an embodiment, gate strips 22 are formed of doped polysilicon, and hence are alternatively referred to as polysilicon strips 22. In other embodiments, gate strips 22 are formed of other conductive materials such as metals, metal silicides, metal nitrides, and the like. Gate dielectrics 24 may be formed of silicon oxide, silicon oxynitride, high-k dielectric materials, or other dielectric materials suitable for forming gate dielectrics. The integrated circuit structure may further include other integrated circuit components, such as gate spacers, source/drain regions, silicides (not shown), a contact etch stop layer 26, and the like. Accordingly, top portions of gate strips 22 may include metal silicides, for example, if the gate-first approach is adopted. Gate strips 22 may, or may not, include dummy patterns.

The structure shown in FIG. 4 includes pattern-dense region 100 and pattern-sparse region 200, wherein the pattern density of gate strips 22 in pattern-dense region 100 is greater than the pattern density of gate strips 22 in pattern-sparse region 200. Accordingly, the average distance D2 between gate strips 22 in pattern-dense region 100 is smaller than the average distance D2 in pattern-sparse region 200.

Inter-dielectric layer (ILD) 30 is formed to fill the gaps between gate strips 22. Preferably, an over-fill is performed, so that the low points of the top surface of ILD 30 are higher than top surfaces 32 of gate strips 22. If CESL 26 is formed, the low points of the top surface of ILD 30 are higher than top surfaces 34 of CESL 26. ILD 30 may be formed of borophosphosilicate glass (BPSG), borosilicate glass (BSG), carbon doped low-k dielectric materials, silicon oxide, or the like. In an exemplary embodiment, a chemical vapor deposition (CVD) method, such as plasma enhanced CVD, low-pressure CVD, or the like, is used to form ILD 30. As a result, the topography of gate strips 22 is transferred, at least partially, to the top surface of ILD 30, and hence humps 36 are formed. The spacing between humps 36 in pattern-dense region 100 is smaller than the spacing in pattern-sparse region 200. Due to the high aspect ratio of the gaps, voids 38 may be formed.

Figure 5A:
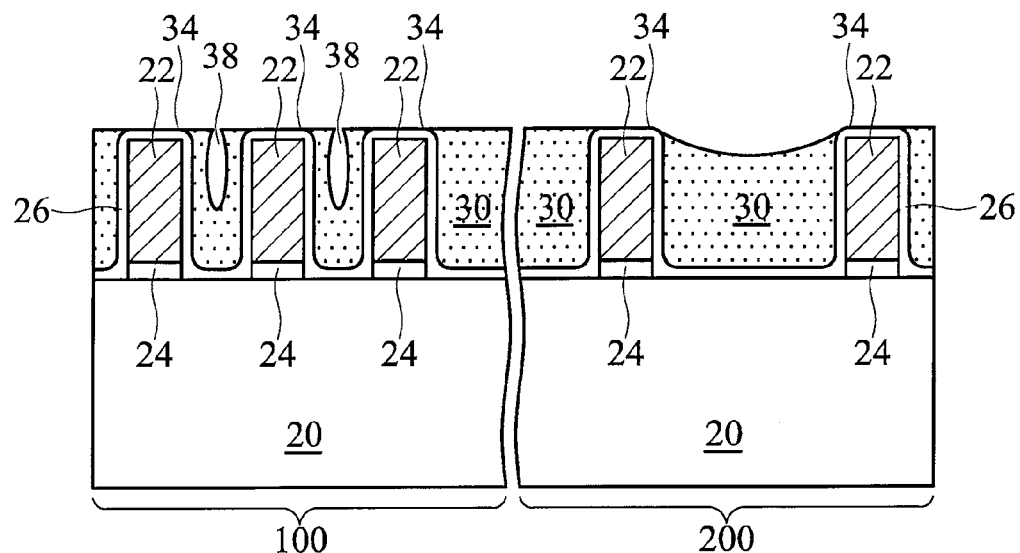

A first chemical mechanical polish (CMP) is performed to remove excess material of ILD 30, and to planarize the top surface of ILD 30. In a first embodiment, as shown in FIG. 5A, the CMP stops at the top surface 34 of CESL 26 that also acts as a CMP stop layer. Accordingly, the portions of CESL 26 directly over gate strips 22 are exposed. In the pattern-dense region 100, since the spacing between gate strips 22 is relatively small, the dishing effect, if any, may be relatively small, and the top surface 34 of exposed CESL 26 is leveled, or substantially leveled, to the top surface of the portions of ILD 30 between gate strips 22. However, an over-CMP may be performed to slightly lower the top surface of ILD 30 in order to expose voids 38. In the pattern-sparse region 200, a noticeable dishing effect may result, and the top surface 34 of the exposed portions of CESL 26 is higher than the top surface of portions of ILD 30 between gate strips 22.

Figure 5B:
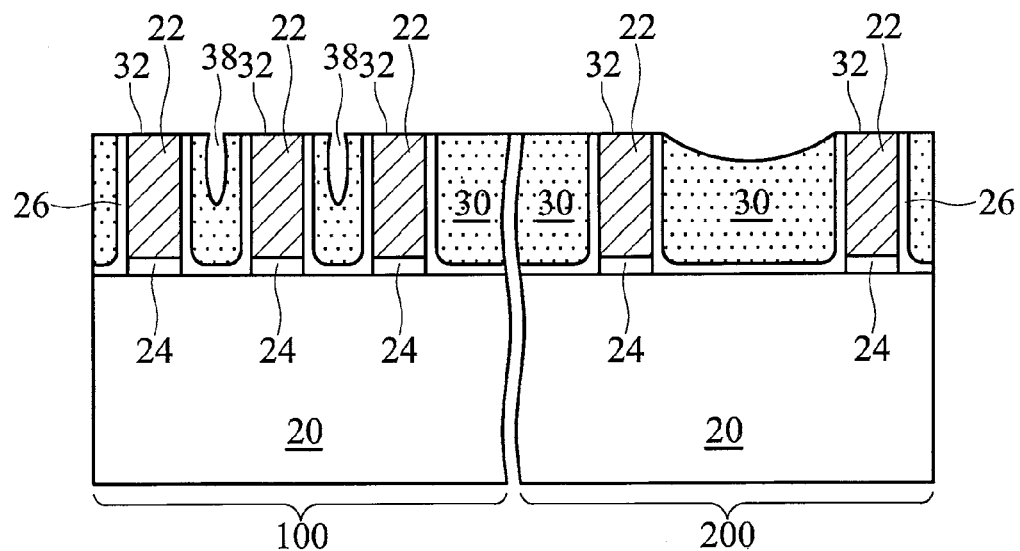

FIG. 5B illustrates an alternative embodiment of the present invention, in which the first CMP stops at the top surfaces 32 of gate strips 22, which may include silicides. This may be the result of no CESL 26, or of using an appropriate slurry to attack CESL 26, but not gate strips 22. Accordingly, the top surfaces 32 of gate strips 22 are exposed. Preferably, the top surfaces 32 of gate strips 22 are exposed throughout the entire wafer after the first CMP.

Figure 6:
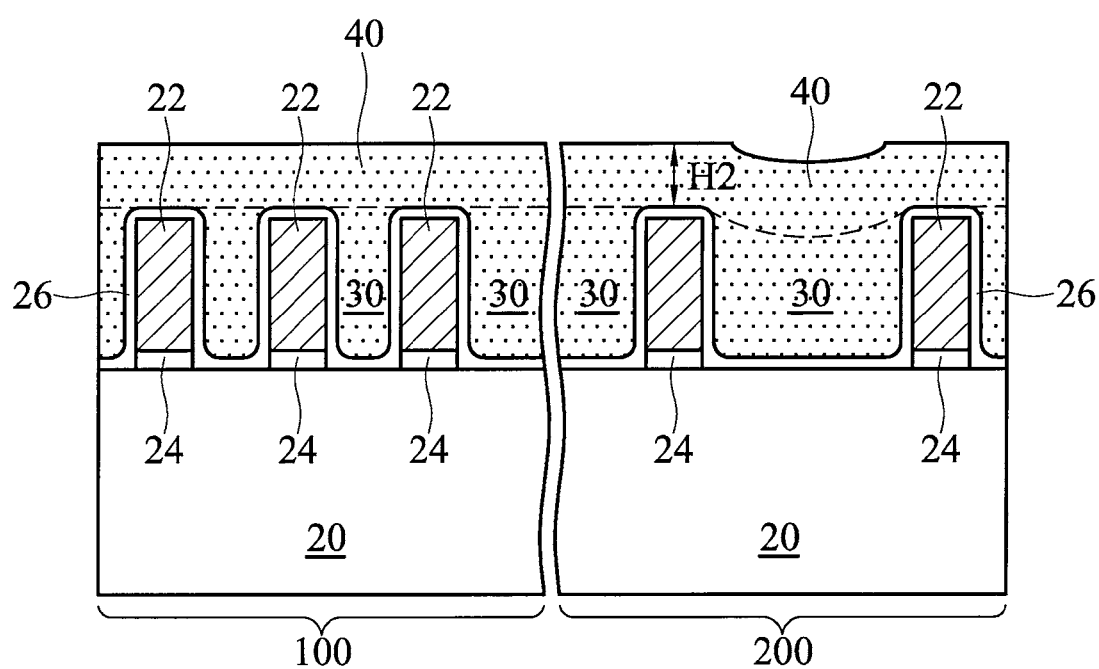

FIG. 6 illustrates the deposition of ILD 40. ILD 40 may be formed of a same or a different material as the material of ILD 30. ILD 40 fully fills the dish caused by the first CMP. Advantageously, ILD 40 also fills voids 38 when voids 38 are exposed. The top surface of ILD 40 is preferably higher than the top surfaces 32 of gate strips 22 (and the top surface 34 of CESL 26 if it exists). Preferably, the height H2 of excess ILD 40 is smaller than height H1 of excess ILD 30 (refer to FIG. 4), so that less effort is required in the subsequent second CMP, as shown in FIGS. 7A and 7B.

Figure 7A:
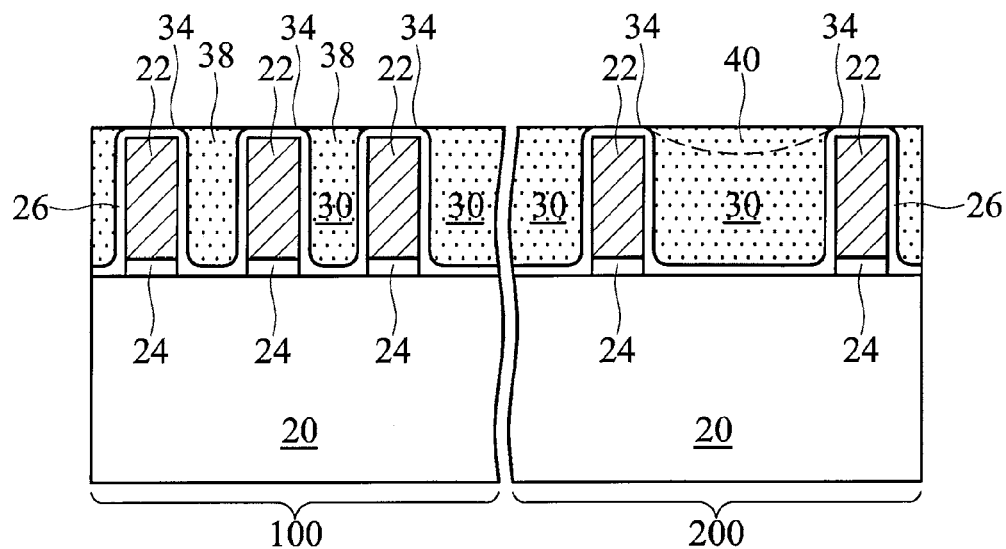
Figure 7B:
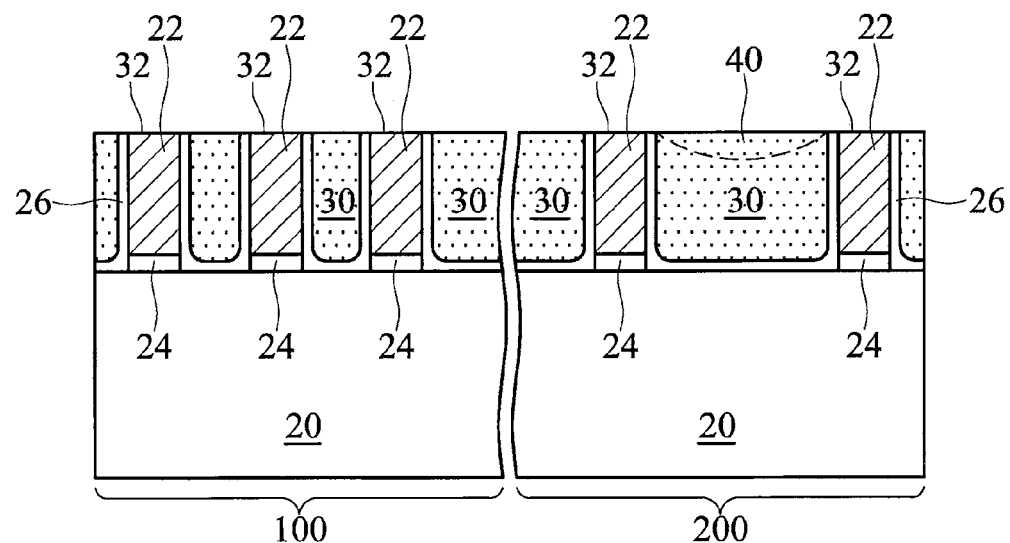

In FIGS. 7A and 7B, a second CMP is performed. In an embodiment, as shown in FIG. 7A, the second CMP stops at top surfaces 34 of CESL 26. FIG. 7B illustrates an alternative embodiment, wherein, after the second CMP, top surfaces 32 of gate strips 22 are exposed. In this embodiment, either there is no CESL 26, or CESL 26 is polished in the first or the second CMP. An advantageous feature of the second CMP is that the dishing effect in ILD 40 is significantly smaller than the dishing effect in ILD 30. This may be partially because ILD 40 does not have humps, while ILD 30 has humps 36 (refer to FIG. 4).

If the dishing effect in ILDs 30 and 40 is still greater than desirable, the steps shown in FIGS. 6 and 7A or 7B may be repeated to further reduce the dishing effect.

Figure 8:
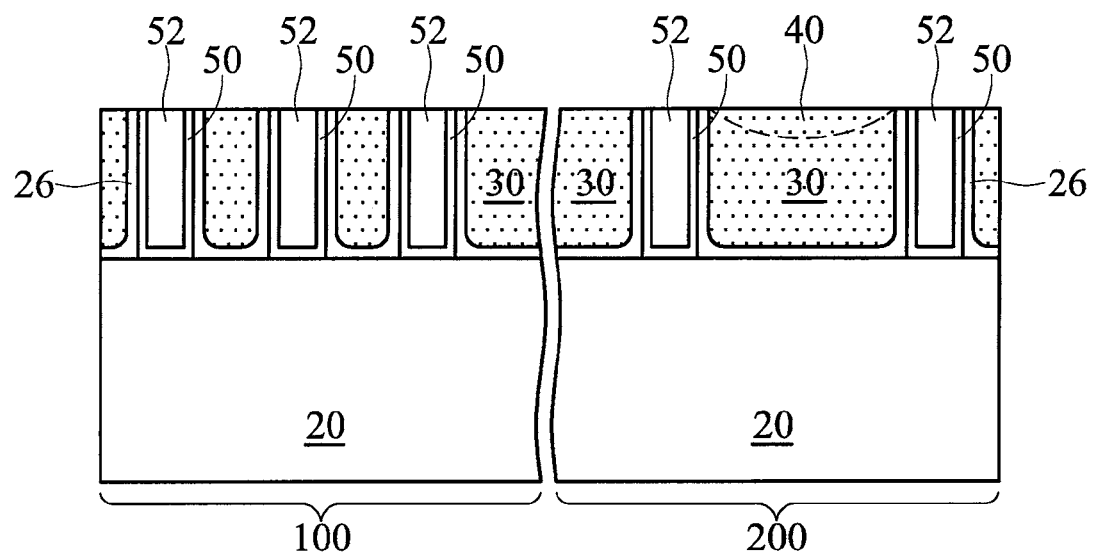
FIG. 8 illustrates metal gates formed after replacing the polysilicon gate strips shown in FIG. 7A with metal gates.
Figure 9A:
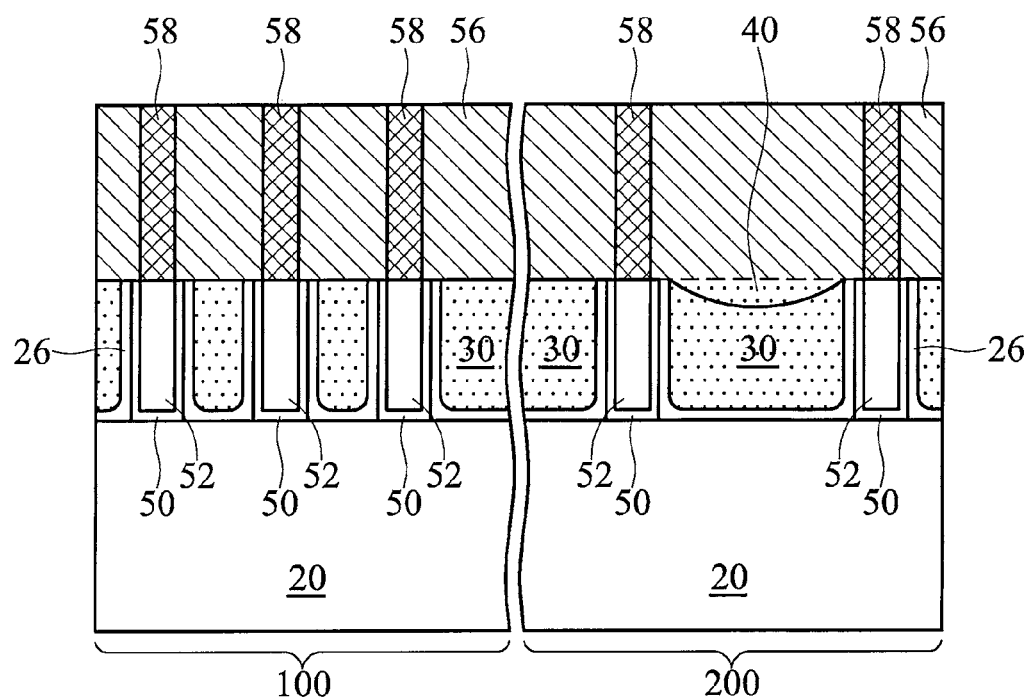
FIGS. 9A and 9B illustrate the formation of contact plugs in inter-layer dielectrics.

Referring to FIG. 8, polysilicon strips 22 and the preformed dielectrics 24 are removed through ILDs 30/40, forming openings (the spaces occupied by features 50 and 52). Next, a gate dielectric layer, preferably formed of a high-k dielectric material, is blanket formed, followed by the filling of a metallic material into the openings. Next, a CMP is performed to remove portions of the gate dielectric layer and the metallic material over ILDs 30/40. The remaining gate dielectric layer and metallic material in the openings form gate dielectric 50 and gate electrode 52 of the resulting MOS devices. In FIG. 9A, an additional ILD 56 is formed, followed by the formation of contact plugs 58 in ILD 56. Contact plugs 58 are electrically connected to gate strips 22 and source/drain regions (not shown).

Figure 9B:
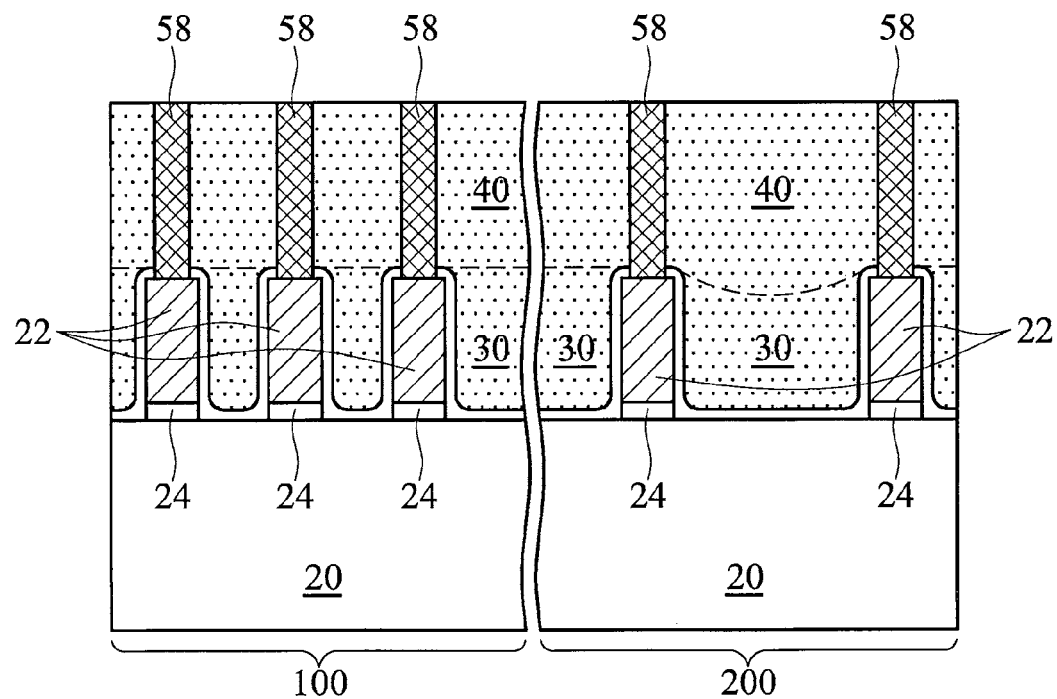

FIG. 9B illustrates another embodiment of the present invention. The initial steps of this embodiment are essentially the same as shown in FIGS. 4 through 6, except the height of ILD 40 is determined according to the requirement for forming contact plugs 58 therein. After the formation of ILD 40, a light CMP may be performed to level the top surface of ILD 40. Contact plugs 58 are then formed in ILDs 40 and 30 to connect to gate strips 22 and source/drain regions (not shown).

The teaching provided in FIGS. 4 through 7B is readily applicable to gap-filling involving different materials. For example, in the manufacture of integrated circuits, conductive materials are often used to fill the gaps/openings in dielectric materials. An exemplary embodiment is shown in FIGS. 10 through 14, which show a damascene process for forming an interconnect structure.

Figure 10:
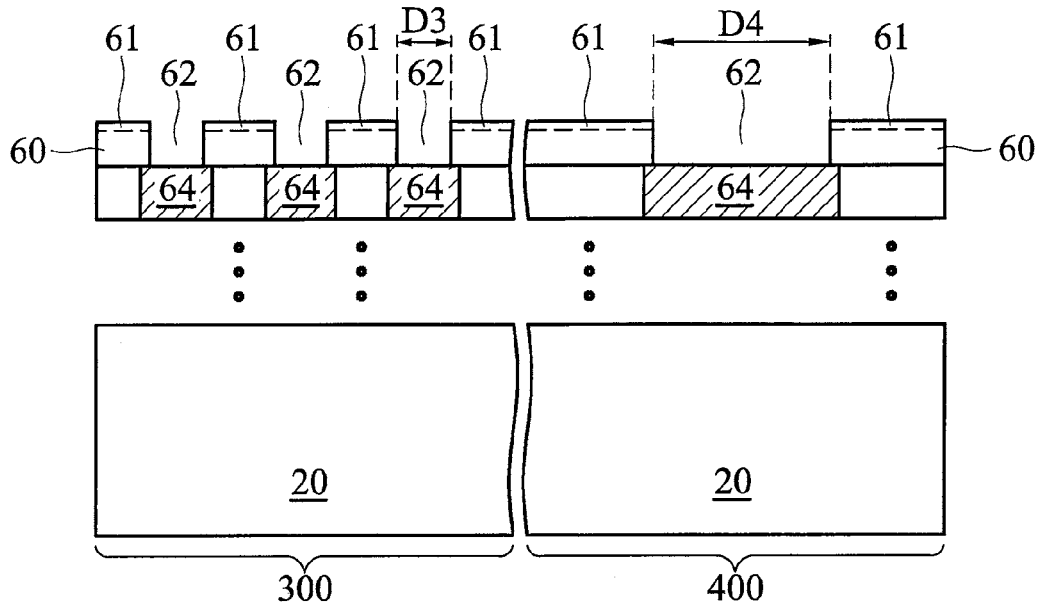
FIGS. 10 through 14 illustrate a damascene process, in which more than one CMP is performed to form metal lines.

Referring to FIG. 10, dielectric layer 60, also referred to as an inter-metal dielectric (IMD) 60, is formed over semiconductor substrate 20. IMD 60 may, or may not, include CMP stop layer 61 on the top surface of dielectric layer 60. Openings 62 are formed in IMD 60. IMD 60 also includes pattern-dense region 300 and pattern-sparse region 400, wherein openings 62 in pattern-dense region 300 have a width D3 less than a width D4 in pattern-sparse region 400. Alternatively, the pattern-dense region 300 and pattern-sparse region 400 may be caused by different numbers of metal lines in regions 300 and 400, even if openings 62 in pattern-dense region 300 and pattern-sparse region 400 are substantially the same. Conductive features 64 may be exposed through openings 62, and may be electrically connected to gate strips 22 (not shown, refer to FIG. 4) and/or gate electrode 52 (not shown, refer to FIG. 8). In an exemplary embodiment, conductive features 64 are contact plugs formed in the ILDs 30/40 (not shown in FIG. 10, please refer to FIGS. 7A and 7B). Alternatively, conductive features 64 represent vias in metallization layers.

Figure 11:
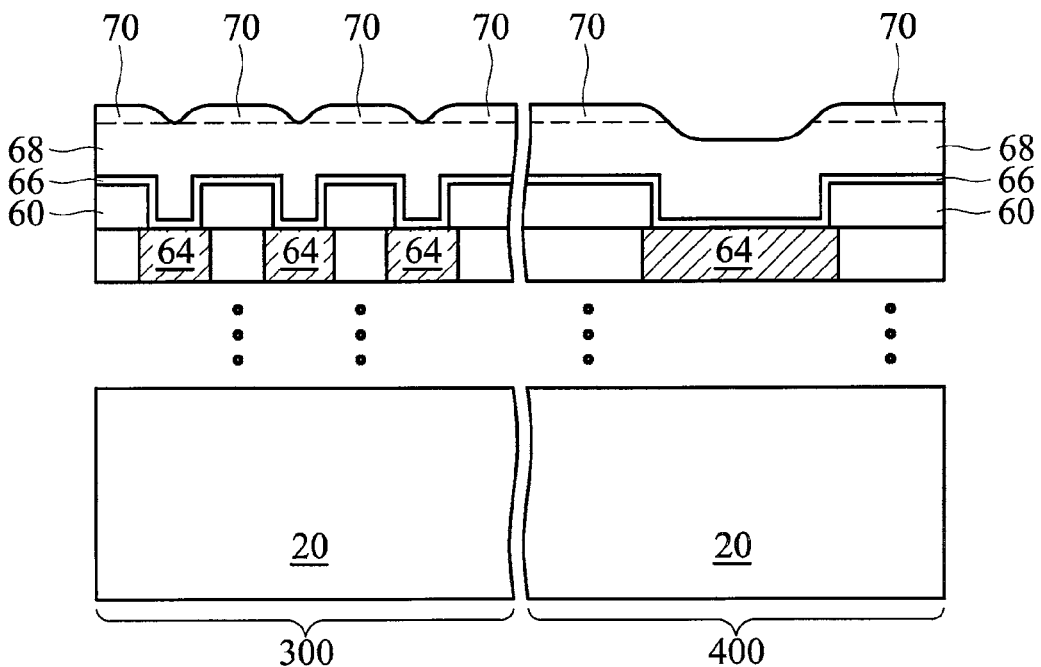

Referring to FIG. 11, diffusion barrier layer 66 is blanket formed, followed by the filling of openings 62 with conductive material 68. In an exemplary embodiment, diffusion barrier layer 66 is formed of titanium, titanium nitride, tantalum, tantalum nitride, or the like. Conductive material 68 may include copper or copper alloys. Humps 70 are formed in conductive material 68 due to the uneven surface of the underlying structure.

Figure 12:
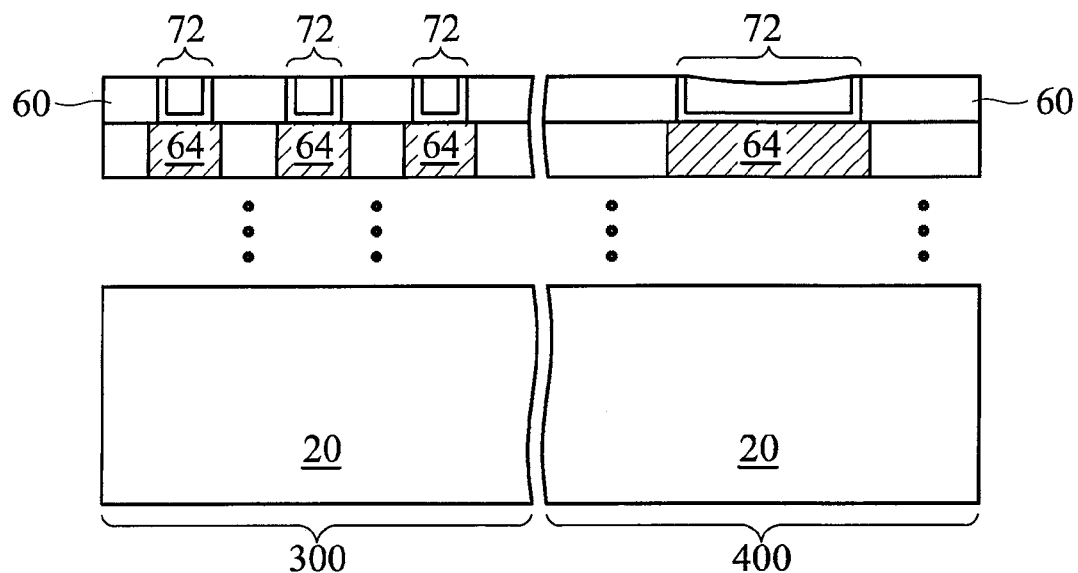

In FIG. 12, a first CMP is performed to remove excess portions of diffusion barrier layer 66 and conductive material 68 over dielectric layer 60. Dielectric layer 60 is thus exposed. Alternatively, in the first CMP, diffusion barrier layer 66 is used as a CMP stop layer, and hence is exposed after the first CMP, while the underlying dielectric layer 60 is not exposed. It is noted that the dishing effect may result from the first CMP, particularly in the pattern-sparse region 400. In the resulting structure, metal lines 72 are formed.

Figure 13:
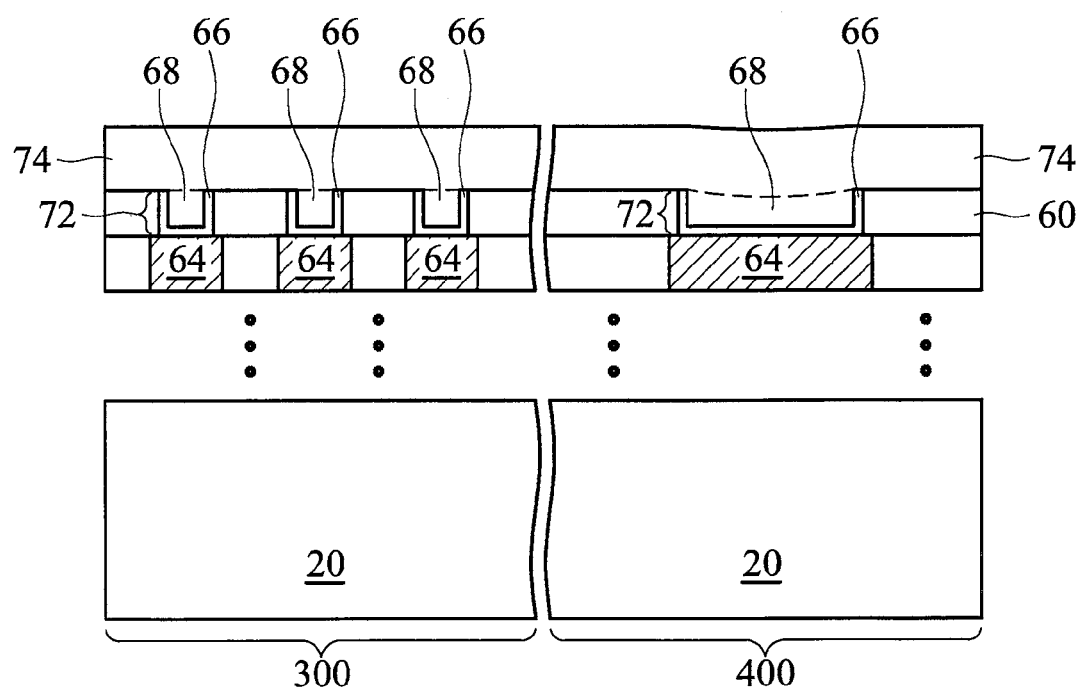
Figure 14:
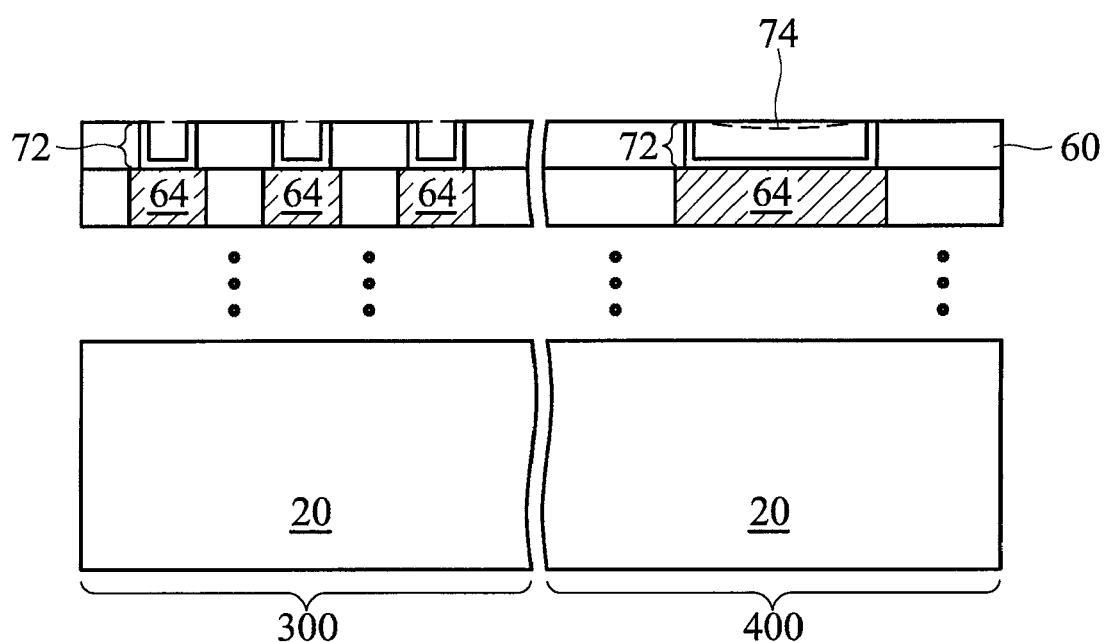

In FIG. 13, conductive material 74 is formed, which may include same or different materials as conductive material 68 (refer to FIG. 11). Next, as shown in FIG. 14, a second CMP is performed to remove excess conductive material 74. The second CMP stops at the top surface of dielectric layer 60. After the second CMP, the dishing effect (and/or voids), if any, will be significantly less severe than after the first CMP. A more leveled surface will thus be provided for the subsequent process steps. It is appreciated that although FIGS. 10 through 14 illustrate a single damascene process, the same teaching is also available for dual damascene processes.

Experiments have shown that by using the embodiments of the present invention, voids and dishing effects are significantly reduced, and possibly substantially eliminated.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include -within their scope such processes, machines, manufacture, compositions of matter, means, methods, or steps.

What is claimed is:

1. A method of forming an integrated circuit structure, the method comprising:
   providing a semiconductor substrate;
   forming patterned features over the semiconductor substrate, wherein gaps are formed between the patterned features;
   filling the gaps with a first filling material, wherein the first filling material has a first top surface higher than top surfaces of the patterned features;
   performing a first planarization to lower the first top surface of the first filling material, until the top surfaces of the patterned features are exposed;
   depositing a second filling material, wherein the second filling material has a second top surface higher than the top surfaces of the patterned features, wherein a height of the first top surface of the first filling material above the patterned features is greater than a height of the second top surface of the second filling material; and
   performing a second planarization to lower the second top surface of the second filling material, until the top surfaces of the patterned features are exposed.

2. The method of claim 1, wherein the first and the second filling materials are formed of dielectric materials.

3. The method of claim 2, wherein the patterned features comprise gate strips, and wherein the first and the second filling materials comprise inter-layer dielectric materials.

4. The method of claim 3, wherein the patterned features further comprise a contact etch stop layer having portions over the gate strips.

5. The method of claim 3, wherein the top surfaces of the patterned features are top surfaces of the gate strips.

6. The method of claim 1, wherein the first and the second filling materials are a same material.

7. The method of claim 1, wherein the first and the second filling materials comprise different materials.

8. The method of claim 1, wherein the first planarization comprises an over-planarization to expose voids formed in the first filling material.

9. The method of claim 1, wherein the patterned features are portions of an inter-metal dielectric layer, and wherein the first and the second filling materials contain copper.

10. A method of forming an integrated circuit structure, the method comprising:
    providing a semiconductor substrate;
    forming gate strips over the semiconductor substrate, wherein gaps are formed between the gate strips, and wherein the integrated circuit structure comprises a pattern-dense region and a pattern-sparse region, with a higher pattern density of the gate strips in the pattern-dense region than in the pattern-sparse region;
    forming a contact etch stop layer (CESL) having first portions directly over the gate strips, and second portions in the gaps;
    filling the gaps with a first inter-layer dielectric (ILD), wherein the first ILD has a first top surface higher than top surfaces of the gate strips;
    performing a first chemical mechanical polish (CMP), until the first top surface of the first ILD is no higher than top surfaces of the first portions of the CESL, wherein the first CMP stops at the top surfaces of the gate strips;
    depositing a second ILD over the first ILD and the gate strips; and
    performing a second CMP, until a second top surface of the second ILD is no higher than the top surfaces of the first portions of the CESL.

11. The method of claim 10, wherein the second CMP stops at the top surfaces of the first portions of the CESL.

12. The method of claim 10, wherein the second CMP stops at the top surfaces of the gate strips.

13. The method of claim 10, wherein the first CMP comprises an over-CMP to lower the first top surface of the first ILD in the pattern-dense region to a level lower than the top surfaces of the first portions of the CESL, so that a void in the first ILD is exposed.

14. A method of forming an integrated circuit structure, the method comprising:
    providing a semiconductor substrate;
    forming gate strips over the semiconductor substrate, with gaps being formed between the gate strips;
    forming a contact etch stop layer (CESL) comprising first portions directly over the gate strips, and second portions in the gaps;
    forming a first inter-layer dielectric (ILD) over the gate strips and in the gaps;
    performing a first chemical mechanical polish (CMP) to the first ILD, until the first portions of the CESL are exposed;
    performing an over-CMP to the first ILD to remove the first portions of the CESL and to expose the gate strips;
    after the step of performing the over-CMP, depositing a second ILD over the first ILD and the gate strips; and
    performing a second CMP to the second ILD.

15. The method of claim 14, wherein the first ILD comprises voids therein, and wherein the step of performing the over-CMP is performed until the voids are exposed, and wherein the second ILD is filled into the voids.

16. The method of claim 14 further comprising repeating the steps of depositing the second ILD and performing the second CMP to the second ILD.

17. The method of claim 14, wherein the first ILD and the second ILD are formed of different dielectric materials.

18. The method of claim 14, wherein the first ILD and the second ILD are formed of a same dielectric material.

19. A method of forming an integrated circuit structure, the method comprising:
    providing a semiconductor substrate;
    forming gate strips over the semiconductor substrate, wherein gaps are formed between the gate strips, and wherein the integrated circuit structure comprises a pattern-dense region and a pattern-sparse region, with a higher pattern density of the gate strips in the pattern-dense region than in the pattern-sparse region;
    forming a contact etch stop layer (CESL) having first portions directly over the gate strips, and second portions in the gaps;
    filling the gaps with a first inter-layer dielectric (ILD), wherein the first ILD has a first top surface higher than top surfaces of the gate strips;
    performing a first chemical mechanical polish (CMP), until the first top surface of the first ILD is no higher than top surfaces of the first portions of the CESL;
    depositing a second ILD over the first ILD and the gate strips; and
    performing a second CMP, until a second top surface of the second ILD is no higher than the top surfaces of the first portions of the CESL, wherein the second CMP stops at the top surfaces of the gate strips.

20. The method of claim 19, wherein the first CMP stops at the top surfaces of the first portions of the CESL.

* * * * *

UNITED STATES PATENT AND TRADEMARK OFFICE
CERTIFICATE OF CORRECTION

| | | |
|---|---|---|
| PATENT NO. | : 7,955,964 B2 | Page 1 of 1 |
| APPLICATION NO. | : 12/152380 | |
| DATED | : June 7, 2011 | |
| INVENTOR(S) | : Wu et al. | |

It is certified that error appears in the above-identified patent and that said Letters Patent is hereby corrected as shown below:

In Col. 8, line 12, claim 15, delete "perfoiining" and insert --performing--.

Signed and Sealed this
Thirteenth Day of September, 2011

David J. Kappos
*Director of the United States Patent and Trademark Office*